United States Patent [19]

Le et al.

[11] Patent Number: 5,680,295
[45] Date of Patent: Oct. 21, 1997

[54] VENTILATED BACKPLANE FOR MOUNTING DISK DRIVES IN COMPUTER SYSTEMS

[75] Inventors: Bao G. Le, Orange; Gregory V. Kabenjian, Duarte, both of Calif.

[73] Assignee: AST Research, Inc., Irvine, Calif.

[21] Appl. No.: 556,668

[22] Filed: Nov. 13, 1995

[51] Int. Cl.⁶ .................................................. H05K 7/20
[52] U.S. Cl. .......................... 361/695; 165/80.3; 361/687; 361/788
[58] Field of Search ................... 312/223.1, 223.2; 364/708.1; 174/16.1; 454/184; 165/80.3, 122, 126; 361/685, 687, 690, 692, 694, 695, 721, 796, 724–727, 797, 829, 803, 831, 788; 439/485

[56] References Cited

U.S. PATENT DOCUMENTS

| | | | |
|---|---|---|---|
| 4,860,163 | 8/1989 | Sarath | 361/384 |
| 4,918,572 | 4/1990 | Tarver | 361/395 |
| 4,967,311 | 10/1990 | Ferchau | 361/395 |
| 5,173,845 | 12/1992 | Shaw | 361/415 |
| 5,313,699 | 5/1994 | Freige | 29/632 |
| 5,343,357 | 8/1994 | Driscoll | 361/685 |
| 5,513,068 | 4/1996 | Girard | 361/685 |
| 5,536,176 | 7/1996 | Borchew | 361/788 |
| 5,557,506 | 9/1996 | Wood | 361/729 |

Primary Examiner—Gerald P. Tolin
Attorney, Agent, or Firm—Knobbe, Martens, Olson & Bear, LLP

[57] ABSTRACT

An improved cooling system for a computer system includes a ventilated backplane for a disk drive cage. The backplane is rigidly secured to the rear of the disk drive cage and includes a plurality of apertures therein to permit convective heat transfer between the inner cavity of the drive cage and the main enclosure of the computer system. A fan assembly is attached to the backplane on the side opposite the drive cage to further enhance heat transfer through the ventilation apertures. In one embodiment, the fan assembly includes a plenum attached to the backplane and a fan attached to the plenum. In another embodiment, a fan housing is attached to the backplane and incorporates one or more fans therein.

8 Claims, 10 Drawing Sheets

VENTILATED BACKPLANE FOR MOUNTING DISK DRIVES IN COMPUTER SYSTEMS

BACKGROUND OF THE INVENTION

1. Field of the Invention

The present invention relates to cooling of disk drives within a computer, and, more particularly, to an apparatus and method for ventilating a disk drive cage using apertures in a backplane.

2. Description of the Related Art

Modern computers often include multiple hard-disk drives, flexible-disk drives, CD-ROM drives, and the like. These drives include motors and mechanisms for spinning the storage media and for moving read heads or read/write heads, and also include circuitry for controlling mechanical movement as well as the transfer of data. For example, a computer system may include a RAID (Redundant Array of Inexpensive Disks) subsystem which includes three or more hard-disk drives.

In computer systems having RAID subsystems, the disk drives are mounted on separate frames or trays and inserted side-by-side into a cavity within the computer. The internal sheet metal chassis of the computer defines guides for aligning connectors on the drives with mating connectors on a rigid backplane. The backplane defines an inner wall of the cavity and provides electrical interconnections to and from the mating connectors. The backplane may be a passive backplane, or it may include electronic components which transfer data to and from the disk drives and which control the disk drives.

Typically, the backplane is constructed of an insulating rigid substrate having the electrical connections formed on one or more layers. The backplane is firmly attached to the internal chassis of the computer, typically with threaded fasteners. The cavity defined on the sides by sheet metal panels of the internal chassis and on the inner wall by the backplane, is termed the "drive cage."

Typically, a computer system having a RAID subsystem has a so-called "tower" configuration wherein the computer system is taller than it is wide, as opposed to a desktop system which is generally wider than it is tall. One aspect of a RAID subsystem is that a disk drive can be readily replaced if it fails during operation. Thus, a RAID subsystem is typically mounted in the computer system so that the disk drives can be extracted and inserted through the front of the computer system cabinet. In order to accommodate this feature, the backplane for the RAID subsystem is mounted with the backplane perpendicular to the side walls of the computer system.

Due to the enclosed nature of the drive cage and the heat-generating drives within, this region is particularly difficult to cool. Indeed, much energy and resources have been expended in attempts to effectively cool the environment within the drive cage. Given enough room, fans can be installed at various locations surrounding the drive cage. For example, fans can be mounted within spaces surrounding the sides of the drive cage within the outer computer cabinet. Alternatively, external fans may draw air from, or blow air into, the drive cage from the exterior of the computer. All of these arrangements introduce trade-offs in space required, added weight, etc. Moreover, the enclosed box configuration of the drive cage limits the efficiency of any cooling arrangement, with the result that the temperature within the drive cage is often only slightly below that which would damage the fragile drive mechanisms, especially when operated over extended periods.

Accordingly, there is a need for an improved apparatus and method for ventilating a disk drive cage, which is both efficient in cooling the cage and less obtrusive than prior designs.

SUMMARY OF THE INVENTION

One aspect of the present invention, is an electronic system having improved cooling for subsystems therein. The electronic system comprises an enclosure and a chassis within the enclosure. A backplane is mounted to the chassis within the enclosure. The backplane is planar and has a first side and a second side wherein the second side is opposite the first side. The backplane has a plurality of slots formed therein to provide a plurality of open passages from the first side to the second side. A plurality of electrical connectors are positioned on the first side of the backplane. The backplane provides electrical interconnections to and from the electrical connectors. A plurality of subsystems are plugged into the electrical connectors. The plurality of subsystems are mounted generally perpendicular to the first side of the backplane with each subsystem spaced apart from adjacent subsystems. At least one fan is mounted proximate to the second side of the backplane. The subsystems generate heat and the fan operates to move air through the open passages and between the subsystems, thereby cooling the subsystems.

Another aspect of the present invention is backplane for an electronic system having a plurality of subsystems. The backplane comprises a first generally planar side and a second generally planar side with the second side opposite the first side. A plurality of openings are formed in the backplane between the first side and the second side. The openings permit air to flow through the backplane between the first side and the second side. A plurality of connectors are positioned on the first side to receive a plurality of subsystems. The connectors are spaced apart such that air flowing through the openings flows between the subsystems to thereby remove heat from the subsystems. Preferably, the backplane includes a fan mounted proximate to the second side of the backplane. The fan operates to move air through the openings to cause the air to flow between the subsystems. Also preferably, a plenum is included which covers the backplane. The fan is mounted to the plenum to move air through the plenum and through the openings in the backplane. Preferably, the plenum is mounted to the backplane. In one embodiment, the backplane includes a plurality of slots and the plenum has a plurality of tabs positioned to engage the slots to mount the plenum onto the backplane. Alternatively, the plenum is screwed to the chassis through the backplane.

Another aspect of the present invention is a ventilated backplane for an electronic system. The vented backplane comprises a generally planar substrate material having first and second opposed sides. At least one of the first and second sides has a plurality of connectors mounted thereon. A plurality of openings are formed in the backplane between the first and second sides to permit air to flow through the backplane.

Another aspect of the present invention is a method for cooling an electronic subsystem. The method comprises the step of mounting the components of the electronic subsystem in a subsystem enclosure having a backplane at one end thereof. The backplane provides electrical interconnections to the subsystem. The backplane has a plurality of apertures formed therein. The method comprises the further step of moving air through the apertures in the backplane to cool the components of the electronic subsystem.

BRIEF DESCRIPTION OF THE DRAWINGS

The preferred embodiment of the present invention will be described below in connection with the attached drawings in which.

DETAILED DESCRIPTION OF THE PREFERRED EMBODIMENTS

Figure 1:
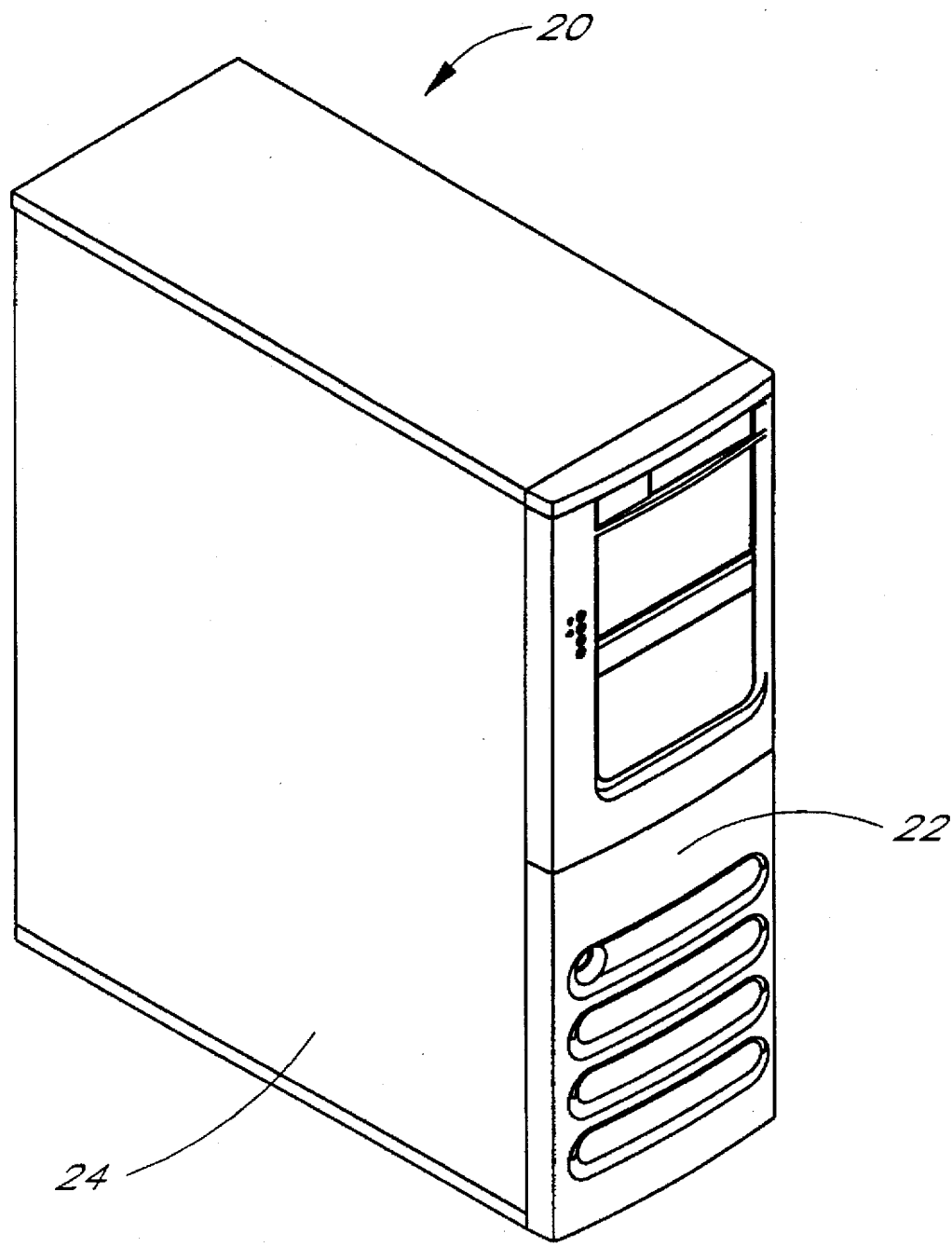
FIG. 1 is a perspective view of a computer incorporating an improved disk drive cooling system of the present invention.

FIG. 1 illustrates an exemplary computer system 20 into which the present invention can be incorporated. The computer system 20 may be of a variety of types, but in the present example is shown as a server system which features a plurality of hard disk drives configured as a RAID system and farther includes one or more floppy drives, CD ROM drives, tape drives, and the like. As illustrated, the computer system 20 is preferably enclosed within a so-called "tower" enclosure or cabinet, which has a height greater than the width of the front thereof and which further has a depth greater than the width of the front. The computer system 20 includes a stylized front panel 22 having controls, indicators and access for one or more floppy disk drives, a CD ROM drive, etc. Further, the front panel 22 may be opened to provide access to the disk drives of the RAID subsystem therein.

On the larger left side of the computer system 20, a side door 24 is provided, which can be easily removed. The computer system 20 is typically assembled such that components within the computer system 20 are easily accessible with the side door 24 removed.

Figure 2:
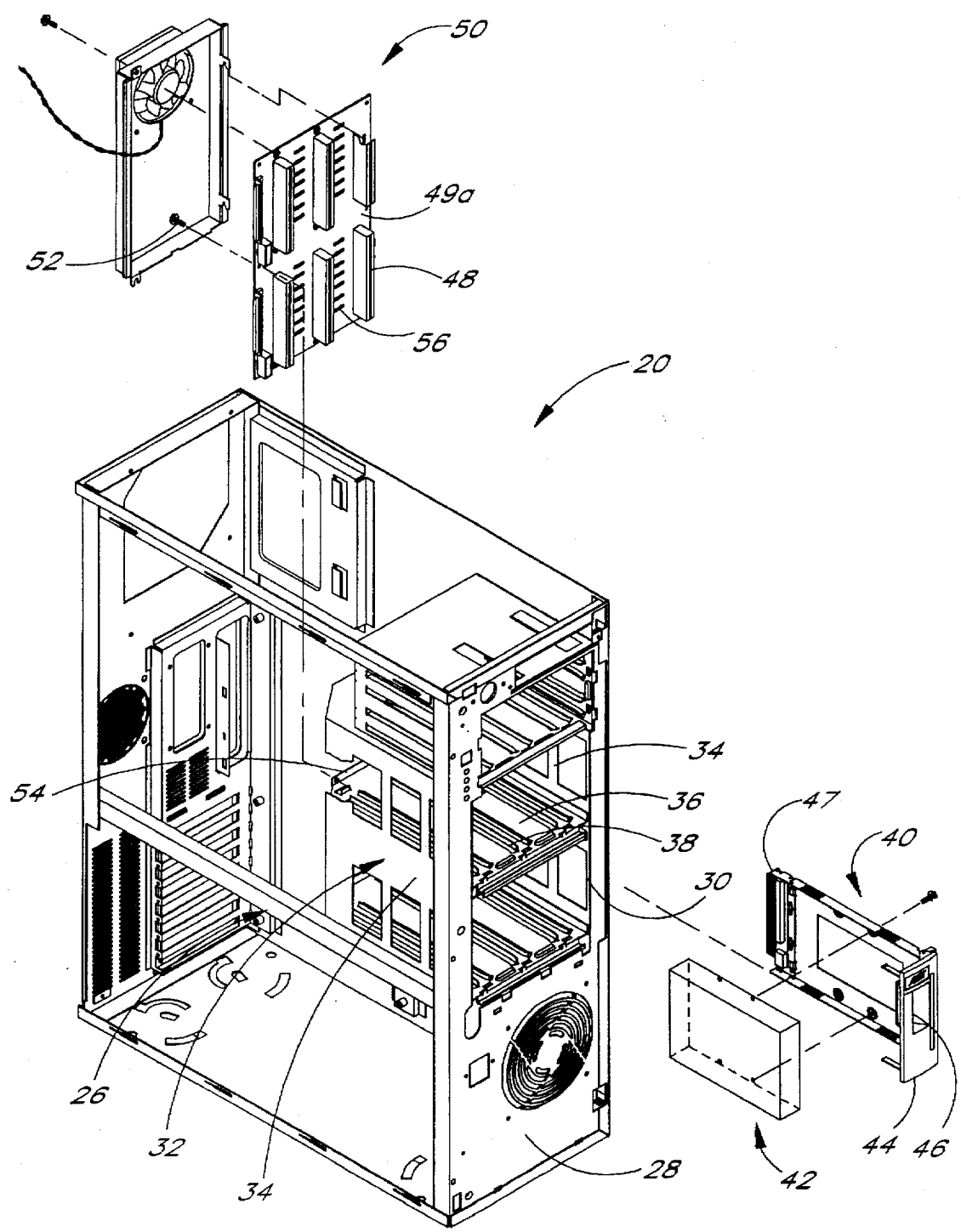
FIG. 2 is a perspective view of a computer with a front panel and side door removed, showing the internal chassis defining a disk drive cage.

As illustrated in FIG. 2, the side door 24 of the computer system 20 has been removed to expose an inner sheet metal chassis 26. The computer system 20 includes a plurality of inner bracings and mounting structures for the various components. In FIG. 2, the stylized front panel 22 has also been removed to expose a planar front plate 28. The front plate 28 includes a large rectangular opening 30 leading to one or more cavities defined within a drive cage 32. The drive cage 32 comprises side walls 34 extending parallel to the side door 24, and a plurality of transverse horizontal shelves 36 provided with guides 38. The guides 38 extend from the opening 30 inward and are sized to receive tray assemblies 40 for hard disk drives 42. More particularly, the disk drives 42 are mounted to the tray assemblies 40, which are vertically orientated and which slide along opposed guides 38 into the cavity defined within the drive cage 32. Each tray assembly 40 includes a front pivoting bezel 44 having a handle 46 therein. The configuration of the tray assembly 40 may be varied, but typically the bezel includes a lever-type latch which assists in inserting and removing the tray assembly 40 from the drive cage 32.

Figure 3:
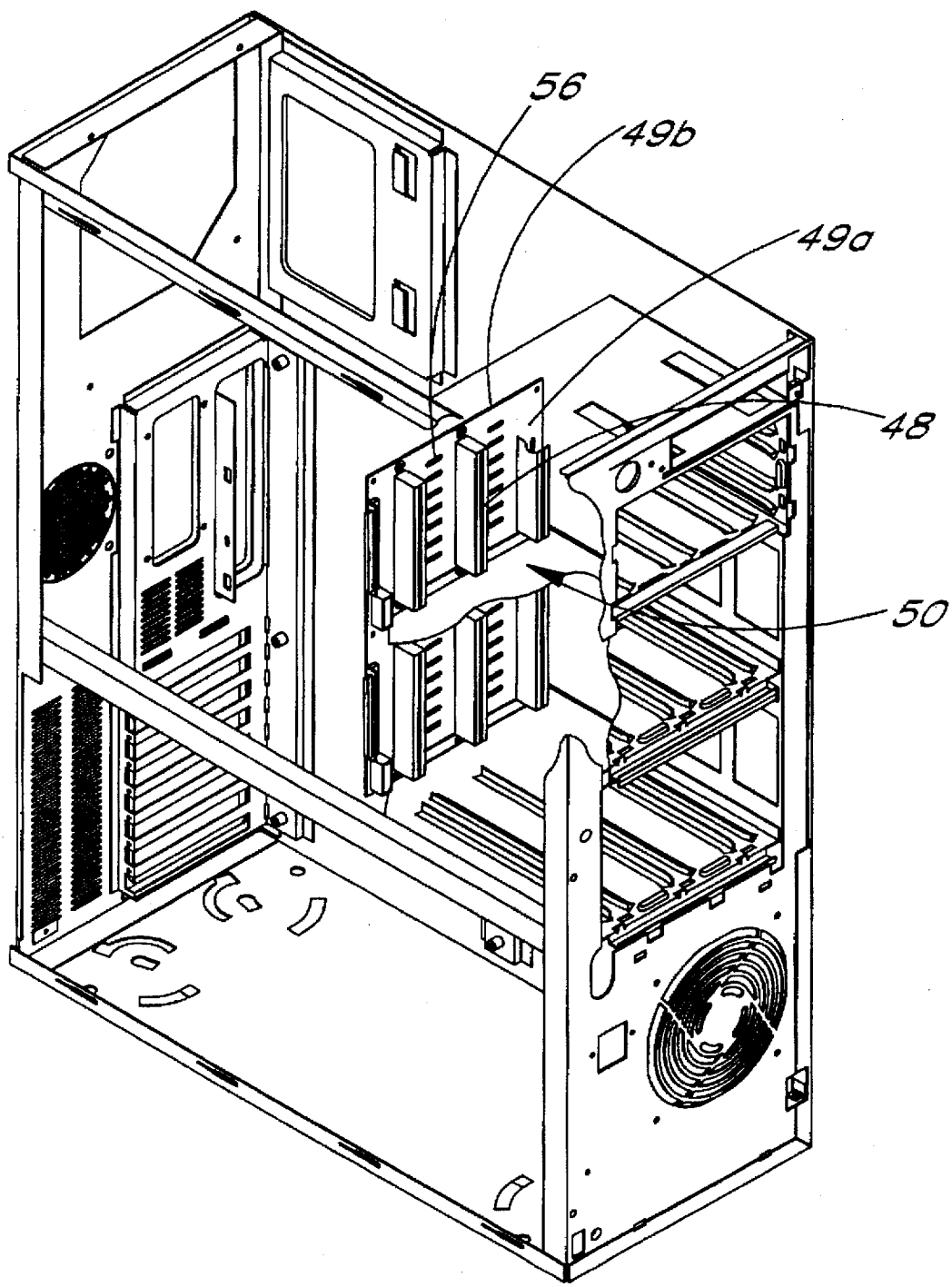
FIG. 3 is a cut-away perspective view of the drive cage, showing a ventilated backplane utilized in the present invention.

As illustrated in both FIGS. 2 and 3, a connector 47 on the rear end of each tray assembly 40 aligns with a mating connector 48 provided on a first planar side 49a of a backplane 50. The disk drive 42 mounts to the tray assembly 40 in a conventional manner and is electrically connected therethrough to the connector 47, as is well known in the art. The backplane 50 defines an inner wall of the drive cage 32 and is securely fastened to the internal chassis 26. More particularly, the backplane 50 includes a plurality of through holes 51 through which threaded fasteners 52 mount into threaded holes within mounting brackets 54 of the chassis. One such fastener 52 is illustrated in FIG. 3, although there are preferably at least six—two each at the corners of the backplane 50 and two at the midpoint of the side edges. The fasteners 52 also ground the backplane 50 to the chassis 26.

Figure 4:
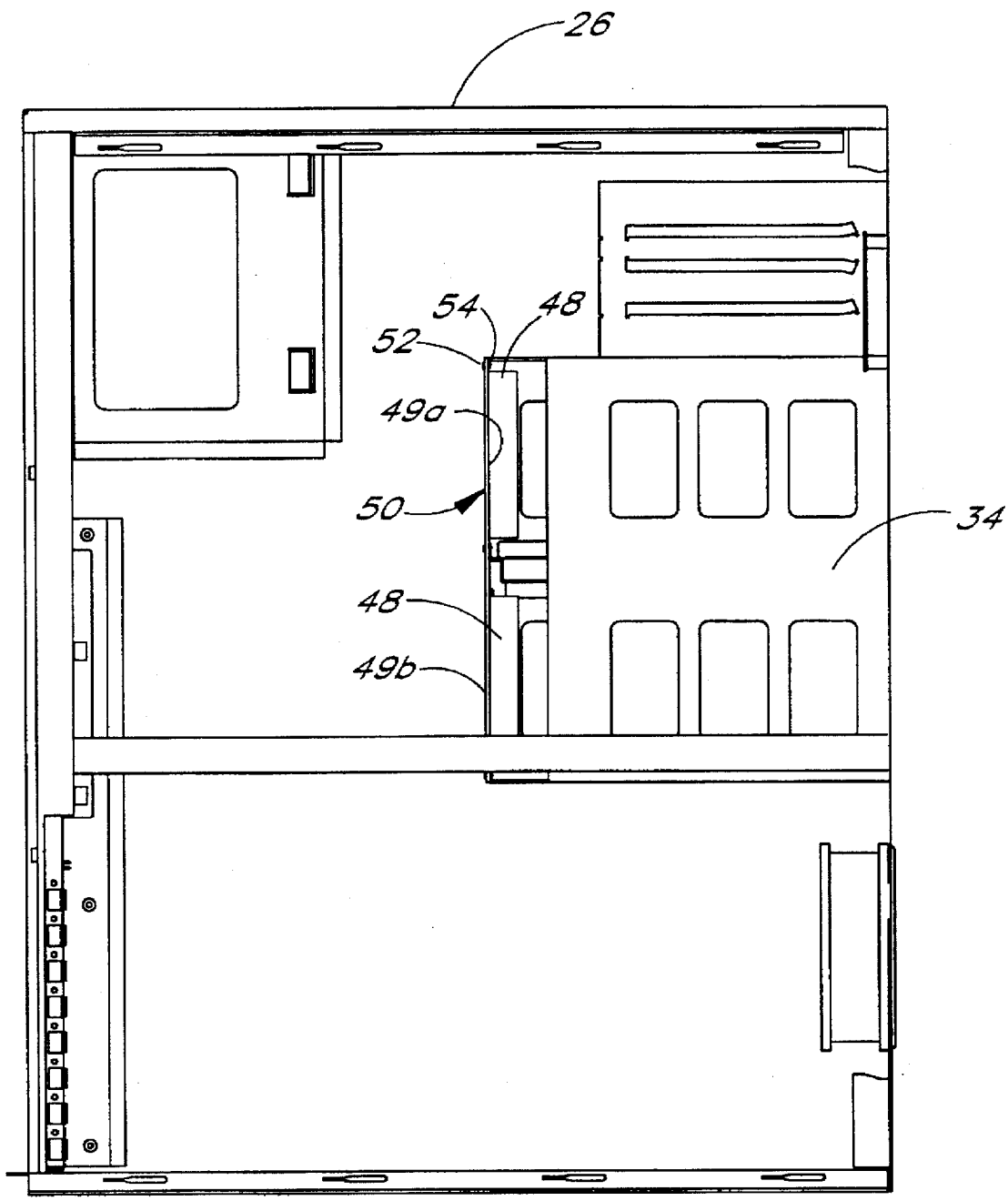
FIG. 4 is a side view of the computer chassis of FIG. 2.
Figure 5:
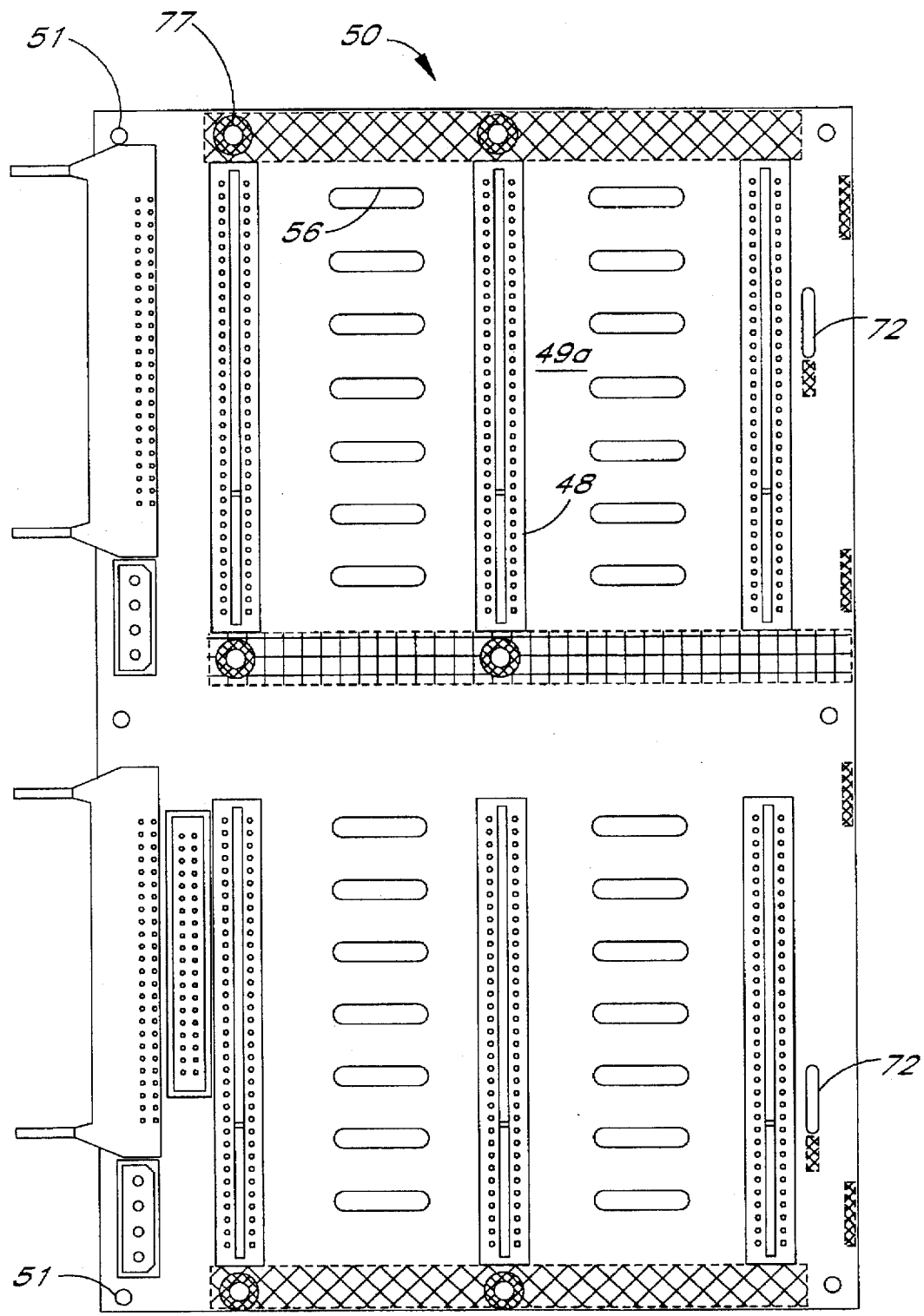
FIG. 5 is a plan view of the backplane, showing disk drive connectors and ventilation apertures therebetween.

The backplane 50 is more clearly seen in FIGS. 3–5, and includes the first planar side 49a and a second, oppositely facing planar side 49b. The backplane 50 includes a plurality of apertures 56 which provide air passages therethrough to ventilate the drive cage 32. In the presently illustrated embodiment, the apertures 56 comprise two parallel columns of horizontally oriented slots 56 having rounded ends. Of course, other configurations of the apertures 56 are contemplated, the primary concern being avoiding the printed circuits on the backplane 50. The apertures 56 greatly enhance the cooling capacity of fans disposed around the drive cage 32. More particularly, the apertures 56 augment currently existing cooling configurations for the drive cage 32 by enhancing convective heat transfer from the drive cage 32. Previous backplanes were solid plates which prevented convection heat flow through the inner wall of the drive cage 32. As previously discussed, this arrangement greatly decreased the efficiency of any cooling arrangement provided for the drive cage 32. Furthermore, the apertures 56 are located at the back of the drive cage 32 so that air flow between the disk drives can pass straight out through the backplane 50. Previous cooling configurations in which fans were placed to the side of the drive cage 32 did not share this advantageous air flow location.

Figure 6:
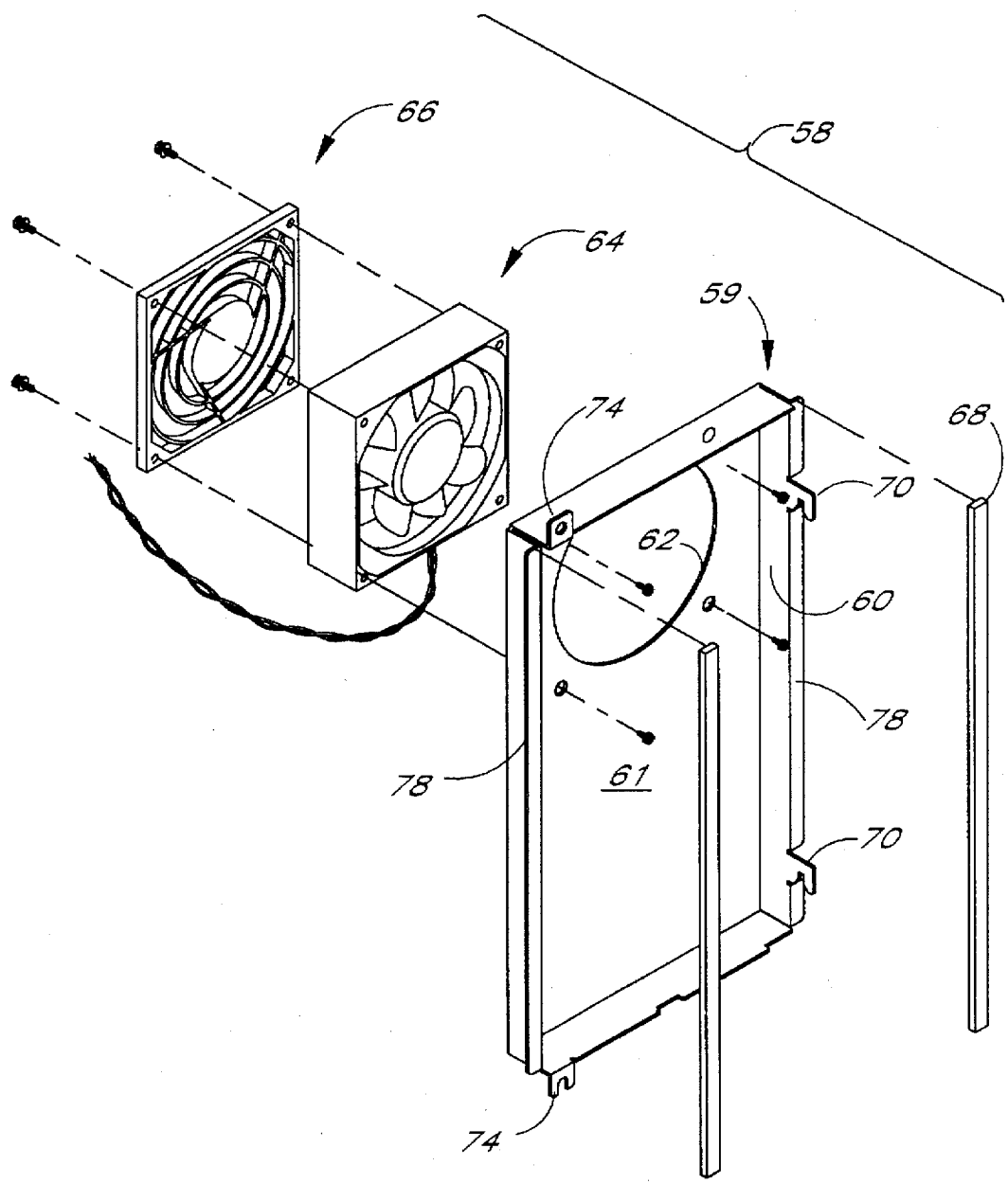
FIG. 6 is an exploded view of a fan assembly and plenum adapted to mount to the ventilated backplane shown in FIG. 5.
Figure 7:
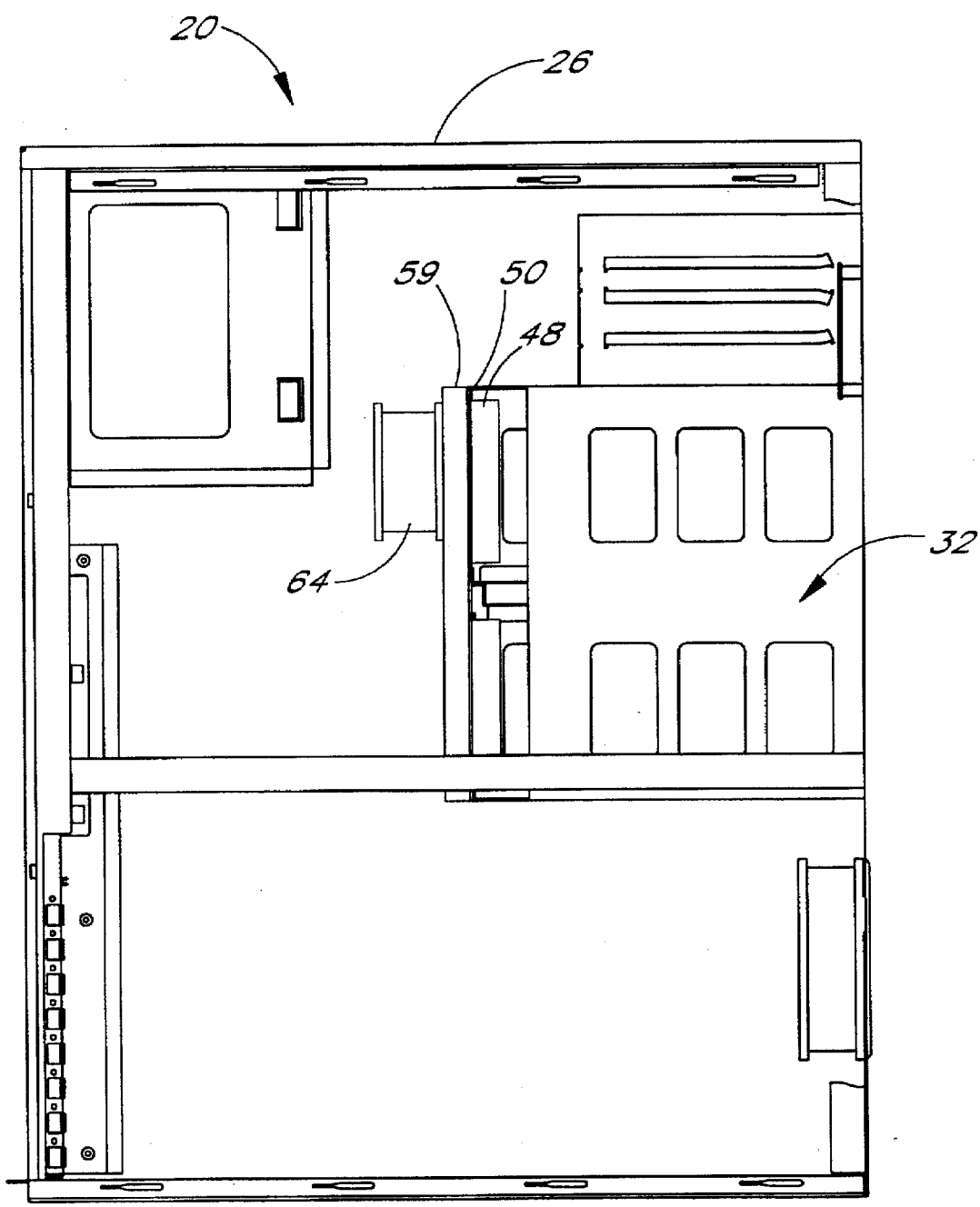
FIG. 7 is a side elevational view of the computer chassis, showing the fan assembly of FIG. 6 mounted to the ventilated backplane.
Figure 9:
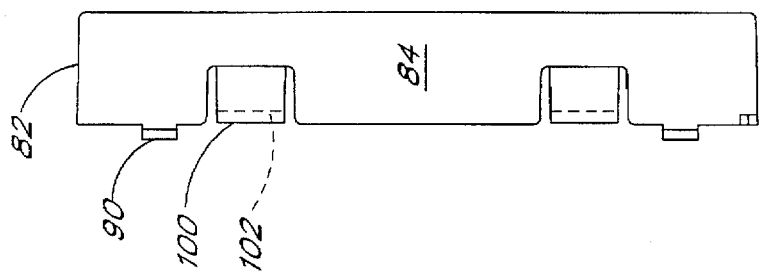
FIG. 9 is a right side elevational view of the fan housing of FIG. 8.

To further enhance the cooling capacity of the apertures 56, a fan assembly is preferably attached to the backplane 50. In one embodiment, shown in FIGS. 6 and 7, the fan assembly 58 comprises a plenum 59 securely fastened to the backplane 50. The plenum 59 comprises a shallow box shape having four narrow sides 60 connected to a rear wall 61, with the opposite wall being open. The plenum 59 is mounted with the open wall juxtaposed against the backplane 50, as shown. A circular fan aperture 62 is formed in the rear wall 61 of the plenum. A fan 64 having a fan guard 66 rigidly attaches to the rear wall 61 at the fan aperture 62.

To reduce vibration transmitted from the fan motor to the backplane 50, a pair of elongated foam strips 68 are placed between the plenum 59 and the backplane 50. One of the sides 60 of the plenum 59 includes a pair of hooks 70 adapted to fit within slots 72 formed in the backplane 50. The hooks 70 are formed in the side 60 of the plenum 59 furthest from the side door 24. Upper and lower tabs 74 extend from two of the other sides 60 at a location closer to the side door 24. The upper and lower tabs 74 receive threaded fasteners 76 that extend into threaded holes 77 within the backplane 50. The plenum 59 is thus relatively easy to install because the hooks 70 are positioned within the slots 72, and the fasteners 76 are simply inserted through the holes in the tab 74 and into the backplane 50. Likewise, removal of the plenum 59 is equally easy. The plenum 59 is further provided with a pair of outwardly extending flanges 78 that contact the foam strips 68. The flanges 78 compress the foam strips 68 against the backplane 50 to reduce vibrations transmitted there between, and also to enhance a seal around the edges of connection between the plenum 59 and the backplane 50.

The fan 64 can either pull air from the interior of the plenum 59 or push air therein. In either case, air is forced between the first and second planar sides 49a, 49b through the passages defined by the apertures 56 in the backplane 50. If air is being pulled from the plenum 59, the hot air generated by the disk drives 42 within the drive cage 32 is exhausted through the fan 64 into the cabinet of the computer 20, which typically has one or more other cooling fans in communication with the ambient atmosphere. Alternatively, if air is pushed into the plenum 59 by the fan 64, cool air is forced into the drive cage 32, which then displaces the hot air there within through any of a plurality of vents surrounding the drive cage, such as for example, through vents in the front panel 22. Typically, the fan 64 runs continuously during operation of the computer system 20; however, the fan 64 may also be responsive to a temperature sensor (not shown) provided within the drive cage 32 to thereby operate only when the drive cage temperature exceeds a predetermined threshold.

Figure 15:
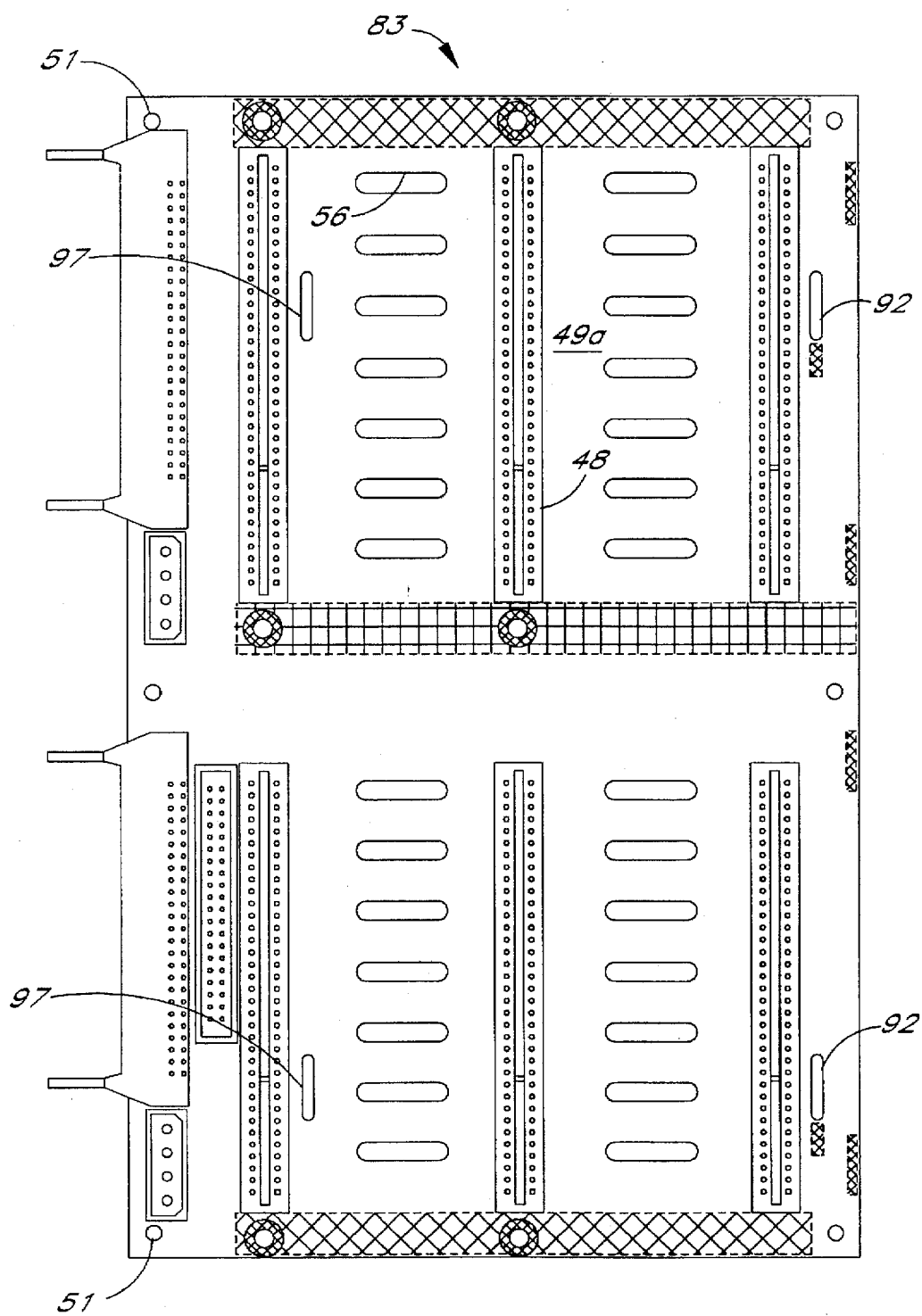
FIG. 15 is a plan view of an alternative backplane for use with the alternative fan housing of FIGS. 8–14, showing disk drive connectors and ventilation apertures therebetween.

FIGS. 8–14 illustrate an alternative fan housing 82 which attaches to an alternative ventilated backplane 83, shown in FIG. 15. In the first fan assembly 58, the fan 64 was attached externally to the plenum 59. This arrangement is preferred if space within the computer system 20 is available because the efficiency of the fan is increased by the seals provided by attachment between the plenum 59 and the backplane 50. In some computer systems, however, space is limited. Thus, the alternative fan housing 82 may be used.

Figures 8, 11:
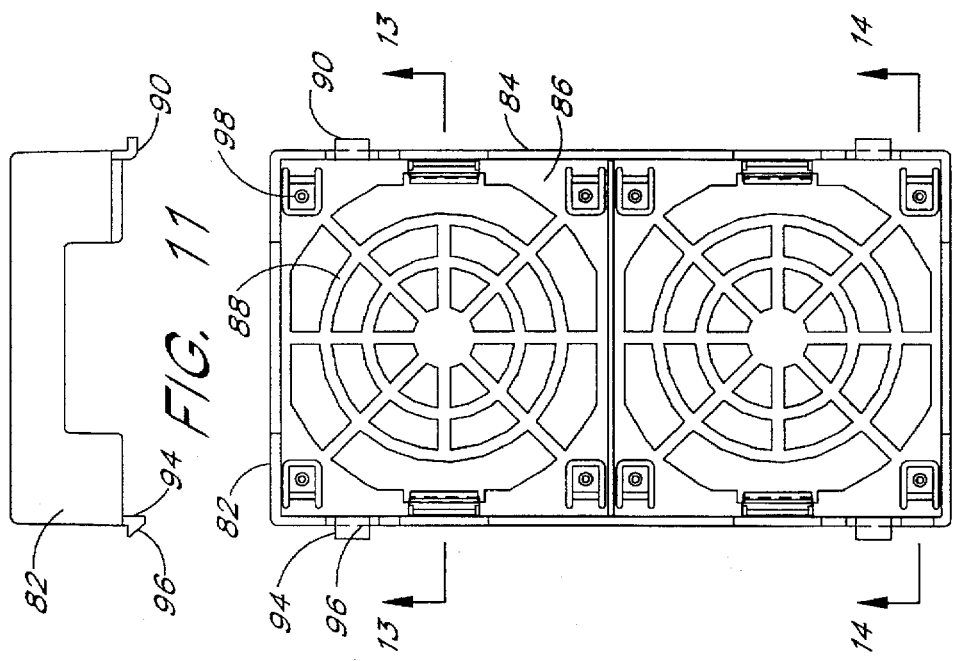
FIG. 8 is a rear elevational view of an alternative fan housing configured to mount to the ventilated backplane.
FIG. 11 is a top plan view of the fan housing of FIG. 8.
Figure 10:
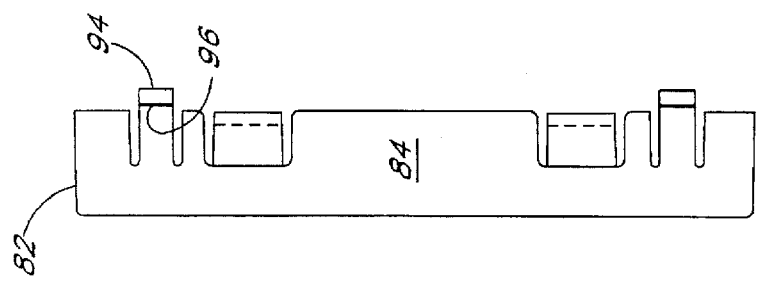
FIG. 10 is a left side elevational view of the fan housing of FIG. 8.
Figure 13:
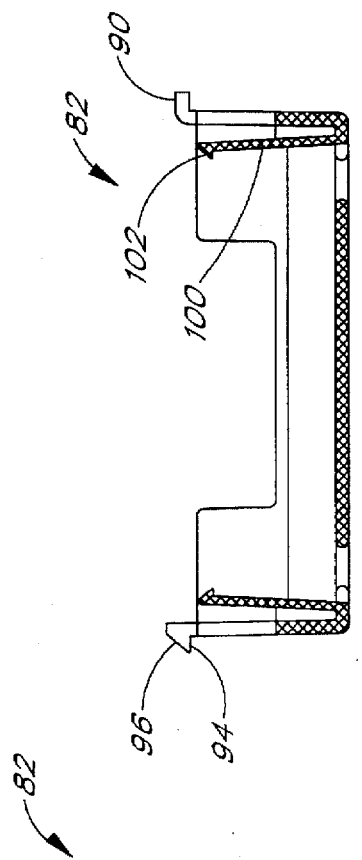
FIG. 13 is a cross-sectional view of the fan housing of FIG. 8 taken along line 13—13.
Figure 14:
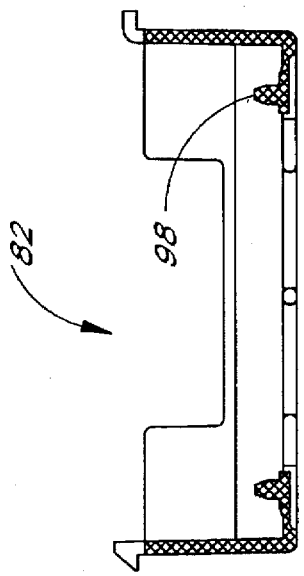
FIG. 14 is a cross-sectional view of the fan housing of FIG. 8 taken along line 14—14.
Figure 12:
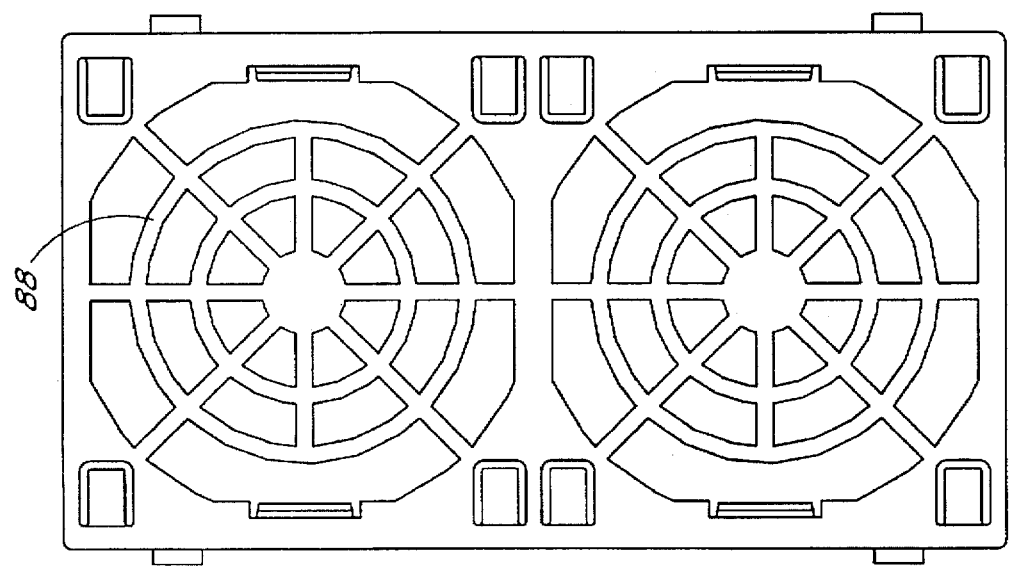
FIG. 12 is a front elevational view of the fan housing of FIG. 8.

The alternative fan housing 82 comprises a plurality of sides 84 and a rear wall 86. The rear wall 86 includes one or more fan grids 88, two of which are shown in FIGS. 8 and 12. To mount to the backplane 83, the fan housing 82 is provided with a pair of outwardly extending hooks 90 on one side. The hooks 90 are adapted to fit within slots 92 in the backplane 83. The hooks 90 are provided on the side of the fan housing 82 away from the side door 24. On the opposite side, a pair of cantilevered latches 94, including outward detents 96, are provided. The latches 94 are sized to fit within slots 97 formed in the backplane 83. To install the fan housing 82 onto the backplane 83, the hooks 90 are fitted within the slots 92, and the cantilevered latches 94 then snap into the slots 97. The outward detents 96 hold the fan housing 82 to the backplane 83, and the housing can be released by simply pressing the latches 94 inward.

The alternative fan housing 82 has a lower profile than the first-described fan assembly 58 due to the mounting configuration of the fan within the housing 82. To secure the fan 64 within the housing 82, a plurality of locating pins 98 extend from an inner face of the rear wall 86. The fan 64 is typically provided with holes for mating with the pins 98, and is pressed into the area between the sides 84 biasing apart a pair of cantilevered fan latches 100. The fan latches 100 include inward detents 102 which retain the fan within the housing 82.

As in the first embodiment of the fan assembly 58, the fan or fans 64 either pull or push air through the ventilation apertures 56. A single fan 64 may be provided within the housing 82, in which case one of the fan grids 88 shown in FIG. 8 is replaced with a solid wall. For the best cooling capacity, a pair of fans 64 are provided within the housing 82 and work continuously during operation of the computer system 20. Alternatively, the operation of the fans 64 may be triggered by a temperature sensor (not shown) within the drive cage 32.

Although this invention has been described in terms of certain preferred embodiments, other embodiments that will be apparent to those of ordinary skill in the art are intended to be within the scope of this invention. Accordingly, the scope of the invention is intended to be defined by the claims that follow.

What is claimed is:

1. A backplane for an electronic system having a plurality of subsystems, said backplane comprising:

a first generally planar side and a second generally planar side, said second side opposite said first side;

a plurality of openings formed in said backplane between said first side and said second side, said openings permitting air to flow through said backplane between said first side and said second side;

a plurality of connectors positioned on said first side to receive a plurality of subsystems, said connectors spaced apart such that air flowing through said openings flows between and cools subsystems plugged into said plurality of connectors; and a fan mounted proximate to said second side of said backplane, said fan operating to move air through said openings to cause air to flow between subsystems plugged into said plurality of connectors; and a plenum mounted to said backplane, said plenum covering said second side of said backplane, said fan mounted in said plenum to move air through said plenum and through said openings in said backplane, wherein said backplane includes a plurality of slots, and wherein said plenum has a plurality of tabs engaging said slots to mount said plenum onto said backplane.

2. A backplane for an electronic system having a plurality of subsystems, said backplane comprising:

a first generally planar side and a second generally planar side, said second side opposite said first side;

a plurality of openings formed in said backplane between said first side and said second side, said openings permitting air to flow through said backplane between said first side and said second side;

a plurality of connectors positioned on said first side to receive a plurality of subsystems, said connectors spaced apart such that air flowing through said openings flows between and cools subsystems plugged into said plurality of connectors; and a fan mounted proximate to said second side of said backplane, said fan operating to move air through said openings to cause air to flow between subsystems plugged into said plurality of connectors;

a plenum which covers said second side of said backplane, said fan mounted in said plenum to move air through said plenum and through said openings in said backplane, wherein said plenum is screwed to said backplane and wherein said backplane is screwed to a chassis.

3. A computer chassis having improved cooling for subsystems therein, said electronic system comprising:

an outer enclosure;

a rigid chassis within said enclosure defining a substantially box-shaped drive cage for receiving a plurality of parallel drive units;

a planar backplane mounted to said chassis within said enclosure to substantially cover a rear end of said cage open to an interior space within said housing, said backplane having a plurality of apertures formed therein to provide a plurality of open passages through said backplane;

a plurality of electrical connectors positioned on said backplane to face into said cage, said backplane providing electrical interconnections to and from said electrical connectors;

at least one fan; and a plenum enclosing said at least one fan, said plenum having hooks, said backplane also having a plurality of slots receiving said hooks to attach and detach the plenum outside of said cage and within said interior space, said fan operating to move air through said open passages and between said subsystems, thereby cooling subsystems plugged into said electrical connectors.

4. The computer chassis of claim 3, further including:

a cantilevered latch extending from said plenum and positioned to fit into one of said slots for releasably locking said plenum to said backplane.

5. The computer chassis of claim 4, wherein two of said hooks are provided on a first edge of said plenum, and two of said cantilevered latches are provided on a second edge opposite said first edge, each of said latches having detents on a respective end to engage a respective one of said slots.

6. The computer chassis of claim 3, further including:

a fastener;

a flange on said plenum for receiving said fastener; and a mounting hole in said backplane which is aligned with said flange when said hooks are received in said slots, said mounting hole sized to receive said fastener to secure said plenum to said backplane.

7. The computer chassis of claim 3, further including:

locking detents extending from an interior surface of said plenum to releasably mount said fans.

8. The computer chassis of claim 3, further including:

a strip of vibration dampening material placed between juxtaposed surfaces of said plenum and said backplane to reduce vibration transmitted therebetween.

* * * * *